(12) United States Patent
Elies (10) Patent No.: US 12,057,853 B2
(45) Date of Patent: Aug. 6, 2024

(54) METHODS AND APPARATUS TO IMPROVE DIFFERENTIAL NON-LINEARITY IN DIGITAL TO ANALOG CONVERTERS

(71) Applicant: Texas Instruments Incorporated, Dallas, TX (US)

(72) Inventor: Brian Elies, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 123 days.

(21) Appl. No.: 17/828,839

(22) Filed: May 31, 2022

(65) Prior Publication Data
US 2023/0087653 A1 Mar. 23, 2023

Related U.S. Application Data (60) Provisional application No. 63/246,825, filed on Sep. 22, 2021.

(51) Int. Cl.
| | |
|---|---|
| *H03M 1/66* | (2006.01) |
| *H03M 1/06* | (2006.01) |
| *H03M 1/80* | (2006.01) |
| *H03M 3/00* | (2006.01) |

(52) U.S. Cl.
CPC ............ *H03M 1/0612* (2013.01); *H03M 1/06* (2013.01); *H03M 1/66* (2013.01); *H03M 1/80* (2013.01); *H03M 3/00* (2013.01)

(58) Field of Classification Search
CPC ........ H03M 1/0612; H03M 1/66; H03M 1/06; H03M 3/00; H03M 1/80; H03M 1/0602; H04L 27/00
See application file for complete search history.

(56) References Cited

U.S. PATENT DOCUMENTS

| | | | |
|---|---|---|---|
| 2006/0261991 A1* | 11/2006 | Lin | ........................ H03M 1/682 341/144 |
| 2013/0039434 A1* | 2/2013 | Oliaei | .................. H04L 25/0278 375/259 |

\* cited by examiner

*Primary Examiner* — Joseph J Lauture
(74) *Attorney, Agent, or Firm* — Brian D. Graham; Frank D. Cimino (57) ABSTRACT

An example apparatus includes: resistor ladder circuitry including a plurality of intermediate voltage nodes; a first plurality of switches having inputs coupled to a plurality of intermediate voltage nodes and having outputs; first level decoder circuitry configured to: receive a set of input bits; and open or close ones of the first plurality of switches based on a first subset of the input bits; a second plurality of switches having inputs coupled to the outputs of the first plurality of switches and having outputs coupled to a common node; and second level decoder circuitry configured to: receive the set of input bits; and open or close ones of the second plurality of switches based on a second subset of the input bits, the first and the second subsets sharing one of the input bits, wherein the output voltage is to be coupled to the common node.

20 Claims, 5 Drawing Sheets

| FIRST LEVEL DECODER CIRCUITRY 204 ||
|---|---|
| DIGITAL INPUT (ALL BITS) | SWITCH NUMBERS |
| 0000 | <0> (206A, 206H, 206I, 206P) |
| 0001 | <1> (206B, 206G, 206J, 206O) |
| 0010 | <2> (206C, 206F, 206K, 206N) |
| 0011 | <3> (206D, 206E, 206L, 206M) |
| 0100 | <3> (206D, 206E, 206L, 206M) |
| 0101 | <2> (206C, 206F, 206K, 206N) |
| 0110 | <1> (206B, 206G, 206J, 206O) |
| 0111 | <0> (206A, 206H, 206I, 206P) |
| 1000 | <0> (206A, 206H, 206I, 206P) |
| 1001 | <1> (206B, 206G, 206J, 206O) |
| 1010 | <2> (206C, 206F, 206K, 206N) |
| 1011 | <3> (206D, 206E, 206L, 206M) |
| 1100 | <3> (206D, 206E, 206L, 206M) |
| 1101 | <2> (206C, 206F, 206K, 206N) |
| 1110 | <1> (206B, 206G, 206J, 206O) |
| 1111 | <0> (206A, 206H, 206I, 206P) |

304

| SECOND LEVEL DECODER CIRCUITRY 208 ||
|---|---|
| DIGITAL INPUT (BITS 3 AND 2) | SWITCH NUMBER |
| 00 | <0'> (210D) |
| 01 | <1'> (210C) |
| 10 | <2'> (210B) |
| 11 | <3'> (210A) |

METHODS AND APPARATUS TO IMPROVE DIFFERENTIAL NON-LINEARITY IN DIGITAL TO ANALOG CONVERTERS

CROSS-REFERENCE TO RELATED APPLICATION

This patent application claims the benefit of and priority to U.S. Provisional Patent Application Ser. No. 63/246,825 filed Sep. 22, 2021, which Application is hereby incorporated herein by reference in its entirety.

TECHNICAL FIELD

This description relates generally to Digital to Analog Converter (DAC) circuitry, and more particularly to methods and apparatus to improve differential non-linearity in DACs.

BACKGROUND

Information may be represented in computing devices as either a digital or analog signal. In many applications, information requires conversion from a digital signal to an analog signal. For example, an amount of data may be stored in digital memory. The digital values may be transformed into an analog voltage. The analog voltage may be transmitted over a medium to a receiving device, played from a speaker as an audio signal, etc.

DAC circuits perform the conversion of digital values to analog voltages and are used in a variety of computing devices. In some examples, the digital to analog to conversion can degrade the quality of the signal, causing information to be lost or distorted. Therefore, signal integrity may be used as a performance metric of a DAC circuit.

SUMMARY

For methods and apparatus to improve differential non-linearity in digital to analog converters, an example apparatus includes resistor ladder circuitry configured to: receive a reference voltage; and generate a plurality of intermediate voltage nodes using the reference voltage and a plurality of resistors; first level decoder circuitry configured to: receive a set of digital input bits; and open or close the first plurality of switches based on a first subset of the digital input bits; a second plurality of switches having inputs coupled to the outputs of the first plurality of switches and having outputs coupled to a common node; and second level decoder circuitry configured to: receive the set of digital input bits; and open or close the second plurality of switches based on a second subset of the digital input bits, the first subset and the second subset to overlap, wherein the common node is configured to produce the output voltage.

BRIEF DESCRIPTION OF THE DRAWINGS

The same reference numbers or other reference designators are used in the drawings to designate the same or similar (functionally and/or structurally) features.

DETAILED DESCRIPTION

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

One metric used to measure the performance of a DAC circuit is differential non-linearity (DNL). DNL refers to the deviation between two analog voltages that are produced by a DAC circuit in response to receiving two sequential digital input bits. For example, a DAC circuit may be expected to produce a first analog voltage for first digital input bits (e.g., 00) and produce a second analog voltage for second, sequential digital input bits (e.g., 01.) The difference between the expected first analog voltage and the expected second analog voltage may be referred to as a least significant bit (LSB) step width.

In practice, the DAC circuit may produce first and second analog voltages that are different than the expected voltages. If the difference between the actual first and second analog voltages is greater than the LSB step width, the DAC circuit may have a positive DNL value. Similarly, if the difference between the actual first and second analog voltages is less than the LSB step width, the DAC circuit may have a negative DNL value. An ideal DAC circuit has DNL values of zero, which means that a step in a digital input value leads to the same sized step in the produced analog voltage for all possible digital input bits.

Many implementations of DAC circuits include a plurality of switches. In such examples, specific switches may be opened or closed based on a digital input value to achieve a desired analog voltage. The use of switches may cause leakage current in a circuit. Leakage current refers to the flow of electrons that across a boundary that is normally viewed as insulating. For example, an ideal switch in an open state would prevent any current from flowing between two nodes. In practice, an actual switch in an open state may allow a small amount of current (i.e., leakage current) to flow between nodes.

In some examples, leakage current can change affect analog voltages produced by a DAC circuit, resulting in DNL values with large magnitudes (i.e., large positive or large negative values) and a loss of performance. To mitigate the effects of current leakage, some previous implementations may reduce the size of resistors in a resistor ladder (e.g., resistor voltage divider) within the DAC circuit to increase the current through the ladder. With increased current through the ladder, the leakage current may have less of an effect on the total current and therefore less of an effect on the corresponding output voltage. However, increasing current through the ladder by reducing resistors also increases the power consumption of the DAC circuit. As compute devices seek low power components to save energy and provide flexibility in design, previous DAC circuit implementations are suboptimal because they are either inaccurate and/or consume large amounts of power due to leakage current.

Example methods and apparatus disclosed herein reduce DNL magnitude and improve DAC circuit performance without increasing power. An example DAC circuit implements a resistive ladder with two or more levels of switches and two or more corresponding example decoder circuits. The example decoder circuits receive different subsets of bits from an input digital value. The subsets of bits overlap such that the example DAC circuit performs a minimum number of switch flips when producing a ramp function. As used herein, a switch flip refers to when a switch changes state (e.g., changes from open to closed or from closed to open.)

Figure 1:
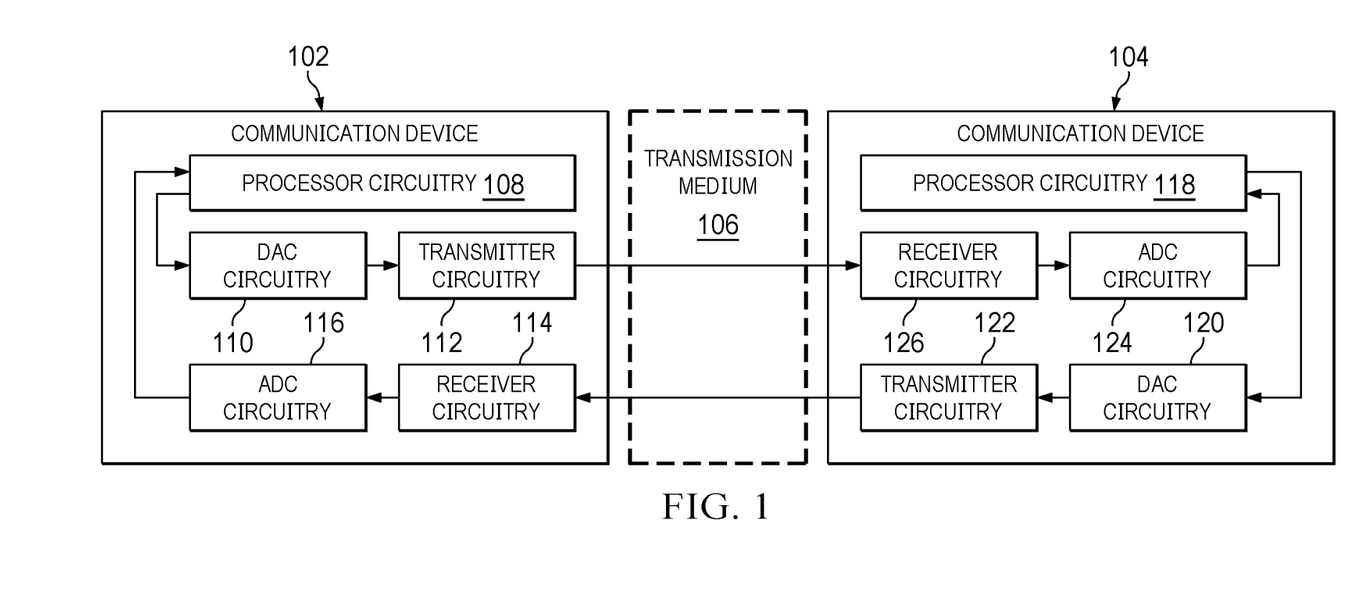
FIG. 1 is a block diagram of an example implementation of two communication devices.

FIG. 1 is a block diagram of an example implementation of two communication devices. FIG. 1 includes an example first communication device 102, an example second communication device 104, and a transmission medium 106. The example first communication device 102 includes example processor circuitry 108, example DAC circuitry 110, example transmitter circuitry 112, example receiver circuitry 114, and example analog to digital converter (ADC) circuitry 116. Similarly, the example second communication device 104 includes example processor circuitry 118, example DAC circuitry 120, example transmitter circuitry 122, example analog to digital converter (ADC) circuitry 124, and example receiver circuitry 126.

The example processor circuitry 108 and example processor circuitry 118 execute machine readable instructions to perform actions for their respective devices. For example, the example first communication device 102 may send an acknowledgement message to the example second communication device 104. In response to receiving the acknowledgement message, the example second communication device 104 may send a response message to the example first communication device 102. In such an example, the example processor circuitry 108 may execute instructions to provide data that forms the acknowledgement message to the example DAC circuitry 110 as digital input bits. Later, the example processor circuitry 118 may execute instructions to provide data that forms the response message to the example DAC circuitry 120 as digital input bits. The example processor circuitry 108, 118 may be implemented by any type of processor, including but not limited to include programmable microprocessors, Field Programmable Gate Arrays (FPGAs) that may instantiate instructions, Central Processor Units (CPUs), Graphics Processor Units (GPUs), Digital Signal Processors (DSPs), microcontrollers and integrated circuits such as Application Specific Integrated Circuits (ASICs), etc.

The example DAC circuitry 110 and example DAC circuitry 120 are both implemented according to the teachings of this disclosure. The example DAC circuitry 110, 120 receive digital input values and produce analog voltages based on the input values. The example DAC circuitry 110, 120 may receive any number of digital input values in any format. The example DAC circuitry 110, 120 are explored further in FIGS. 2, 3, 4.

The example transmitter circuitry 112 and example transmitter circuitry 122 receive analog voltages from the example DAC circuitry 110 and example DAC circuitry 120, respectively. The example transmitter circuitry 112, 122, transmits the analog voltage to an external device over the transmission medium 106. In the foregoing example, the transmitter circuitry 112 sends the acknowledgement message to the second communication device 104 as an analog voltage over the transmission medium 106. Later in the foregoing example, the transmitter circuitry 122 sends the response message to the first communication device 102 as an analog voltage over the transmission medium 106.

The example transmitter circuitry 112, 122 may use any communication standard and any configuration parameters to transmit the voltage. Example communication standards include but are not limited to an Ethernet, universal serial bus (USB), Bluetooth®, near field communication (NFC), Peripheral Component Interconnect (PCI), Peripheral Component Interconnect Express (PCIe), etc. Similarly, the transmission medium 106 may be implemented by any medium including but not limited to a wireless network, an Ethernet cable, a coaxial cable, a fiber optic cable, etc.

The example receiver circuitry 114, 126 receive analog voltages from external devices via the transmission medium 106. In the foregoing example, the example receiver circuitry 126 receives analog voltages corresponding to the acknowledgement message. Later in the foregoing example, the example receiver circuitry 114 receives analog voltages corresponding to the response message. The example receiver circuitry 114, 126 may use any communication standard and any configuration parameters to receive the analog voltages. In some examples, the example receiver circuitry 114, 126 and example transmitter circuitry 112, 122 may implement one or more of the same communication standards.

The example ADC circuitry 116, 124 receives analog voltages from the respective receiver circuitry 114, 126 and converts the analog voltages into a digital values. The example ADC circuitry 116, 124 may produce any number of digital values in any format. The example ADC circuitry 116, 124 may provide the digital values to the processor circuitry 108, 118 for storage, additional processing, etc. In the foregoing example, the example ADC circuitry 124 provides digital values corresponding to the acknowledgement message to the example processor circuitry 118. Later in the foregoing example, the example ADC circuitry 116 provides digital values corresponding to the response message to the example processor circuitry 108.

The example DAC circuitry 110, 120 facilitate in the transmission of data to an external device. Through implementation as described in FIGS. 2, 3, 4 and according to the teachings of this disclosure, the example DAC circuitry 110, 120 reduce the magnitude of DNL errors when compared to previous implementations by minimizing the number of switch flips while not increasing power consumption. In doing so, the example DAC circuitry 110, 120 may produce analog voltages that more accurately represent the acknowledgement message and the response message than previous implementations of DAC circuits.

Figure 2:
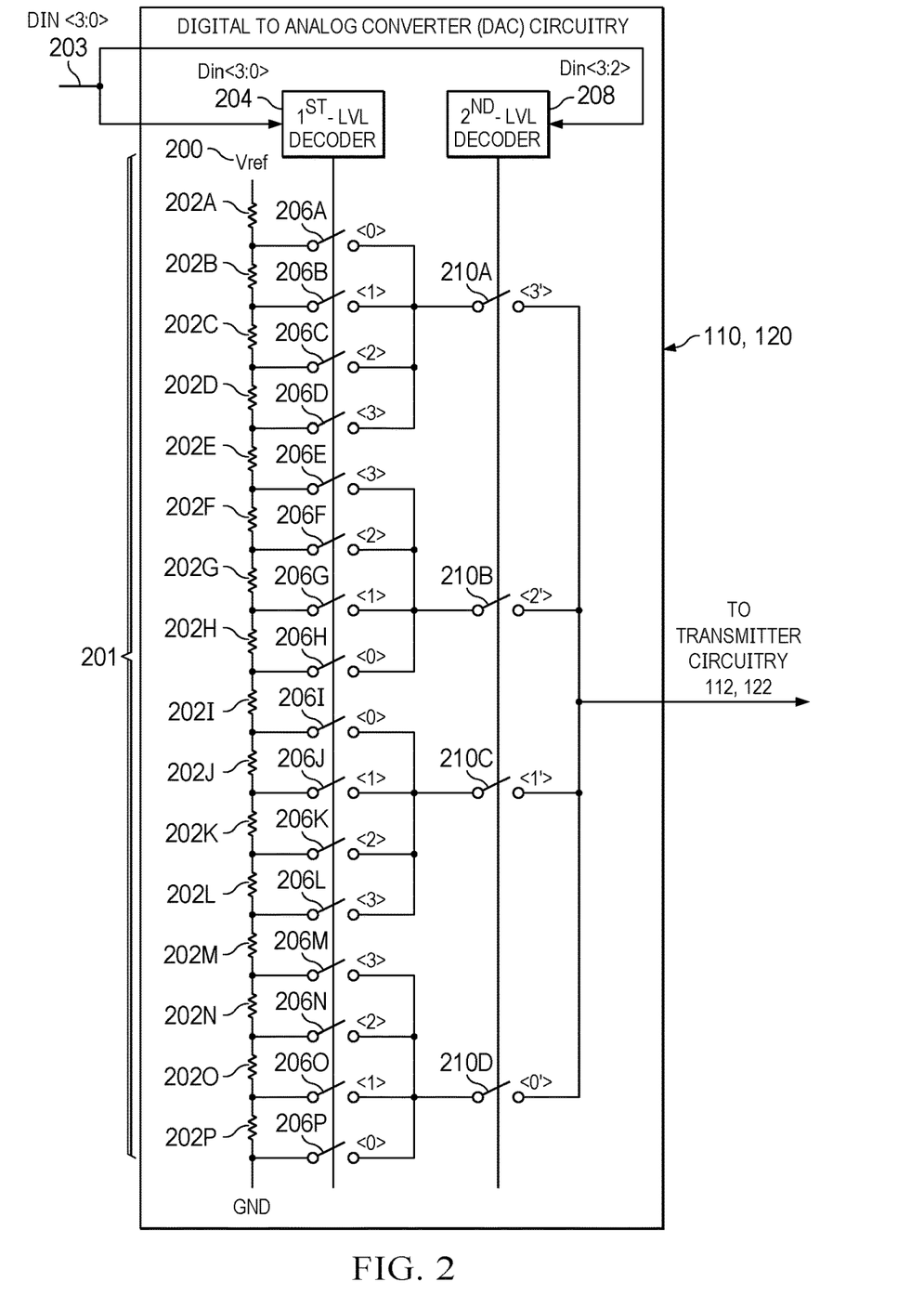
FIG. 2 is a schematic diagram of an example implementation of the DAC circuitry of FIG. 1.

FIG. 2 is a schematic diagram of an example implementation of the DAC circuitry of FIG. 1. FIG. 2 includes example digital input bits 203, the example DAC circuitry 110, 120, and the example transmitter circuitry 112, 122. The example DAC circuitry 110, 120 includes example resistor ladder circuitry 201, example reference voltage 200, example resistors 202A, 202B, . . . , 202P, example first level decoder circuitry 204, example first level switches 206A, 206B, . . . , 206P, example second level decoder circuitry 208, and example second level switches 210A, 210B, 210C, 210D.

The example reference voltage 200 of FIG. 2 is the maximum voltage that the example DAC circuitry 110, 120 may transmit over the physical medium. The example reference voltage may be any voltage. In some examples, the example reference voltage is +3.3 Volts (V.) An example DAC circuitry 110, 120 may access the reference voltage from a power supply on the corresponding communication device 102, 104.

The example resistors 202A, 202B, . . . , 202P connect in series between the reference voltage and ground (GND.) In doing so, the example resistors 202A, 202B, . . . , 202P and the reference voltage form resistor ladder circuitry 201. The resistor ladder circuitry 201 produces a plurality of intermediate voltages at each of the nodes between the resistors 202A, 202B, . . . , 202P. Each of the example resistors 202A, 202B, . . . , 202P may have the same resistance value so that the voltage difference between any two adjacent nodes is equivalent across the entire resistor ladder. In the example implementation of FIG. 2, the voltage between resistors 202O and 202P is $$\left(\frac{1}{16}\right) \times V_{reference},$$

the voltage between resistors 202N and 202O is $$\left(\frac{2}{16}\right) \times V_{reference},$$

etc. While the example DAC circuitry 110, 120 of FIG. 2 is implemented with 16 resistors, in other examples, the DAC circuitry 110, 120 may be implemented with any number of resistors. An example manufacturer may determine the number of resistors in the example DAC circuitry 110, 120 based on the number of example digital input bits 203.

The digital input bits 203 are a sequence of high supply voltages (i.e., '1' bits) and low supply voltages (i.e., '0' bits) that represent data to be transmitted. The example digital input bits 203 of FIG. 2 is four bits in length. As a result, each of the 16 values that can be represented using the four bits corresponds to one of the 16 voltages generated by the voltage ladder. For this reason, the example DAC circuitry 110, 120 of FIG. 2 may be referred to as a 4-bit DAC. The four bits from the example digital input bits are labelled <3:0>, where the bit 0 is the least significant bit (LSB) and bit 3 is the most significant bit (MSB.) The example DAC circuitry 110, 120 may receive the example digital input bits 203 from the corresponding processor circuitry 108, 118.

The example first level decoder circuitry 204 determines which of the first level switches 206A, 206B, . . . , 206 should be opened or closed to achieve a specific analog voltage. The example first level decoder circuitry 204 uses each of the four bits (represented as <3:0>) from the example digital input bits 203 to determine which of the first level switches 206A, 206B, . . . , 206 to open or close. The example first level decoder circuitry 204 is explored further in FIGS. 3, 4.

The example first level switches 206A, 206B, . . . , 206P connect to the nodes in between the resistors 202A, 202B, . . . , 202P. While the input to each of the first level switches 206A, 206B, . . . , 206P is a different node, the output of the first level switches 206A, 206B, . . . , 206P are connected to common nodes. For example, the outputs of switches 206A, 206B, 206C, 206D are connected to form a first common node, the outputs of switches 206E, 206F, 206G, 206H are connected to form a second common node, etc. The first level switches 206A, 206B, . . . , 206P are opened and closed according to the example first level decoder circuitry 204.

The example DAC circuitry 110, 120 is configured such that the groups of switches have the same states. In FIG. 2, a unique state is indicated with "<" ">" symbols. For example, at any point in time, switches 206A, 206H, 206I, and 206P (i.e., the <0> switches) are all open or all closed. Similarly, at any point in time, switches 206B, 206G, 206J, and 206O (i.e., the <1> switches) share states, switches 206C, 206F, 206K, 206N (i.e., the <2> switches) share states, and switches 206D, 206E, 206L, 206M (i.e., the <3> switches) share states. To keep the switches from a given group in the same state, the example first level decoder circuitry 204 may change all switches in a group concurrently. Example manufacturers may group the switches first level switches 206A, 206B, . . . , 206P to share states as a way to reduce the build of materials and/or size of the control logic circuitry required to implement the example DAC circuitry 110, 120.

The example second level decoder circuitry 208 determines which of the second level switches 210A, 210B, 210C, 210D should be opened or closed to achieve a specific analog voltage. The example second level decoder circuitry 208 uses the two MSBs (represented as <3:2>) from the example digital input bits 203 to determine which of the second level switches 210A, 210B, 210C, 210D should be opened or closed. The example second level decoder circuitry 208 is explored further in FIGS. 3, 4.

The example second level switches 210A, 210B, 210C, 210D have inputs that are tied to the common nodes from the outputs of the first level switches 206A, 206B, . . . , 206P. IN turn, the example second level switches may have outputs that are connected to a common node and provided to the example transmitter circuitry 112, 122. Second level switches are implemented to reduce the total number of switches needed In some examples, the DAC circuitry 110, 120 may convert more than four bits into a unique analog voltage. In examples with large number of bit conversions, the example DAC circuitry 110, 120 may include multiple decoders and multiple levels of switches as a way to reduce the build of materials and/or size of the control logic circuitry required when compared to a single level DAC implementation with the same number of bit conversions. Advantageously, the example DAC circuitry 110, 120 implements decoder circuits in a manner such that the subset of bits used by decoders overlap one another. For example, in FIG. 2, bits 3 and 2 of the digital input bits 203 are used by both the first level decoder circuitry 204 and second level decoder circuitry 208. This contrast with previous implementations of DAC circuitry, in which the bits used by various decoders to flip switches belong to mutually exclusive subsets. By overlapping bit inputs to decoders, the example DAC circuitry 110, 120, reduces the magnitude of DNL by minimizing the number of switch flips.

Figure 3:
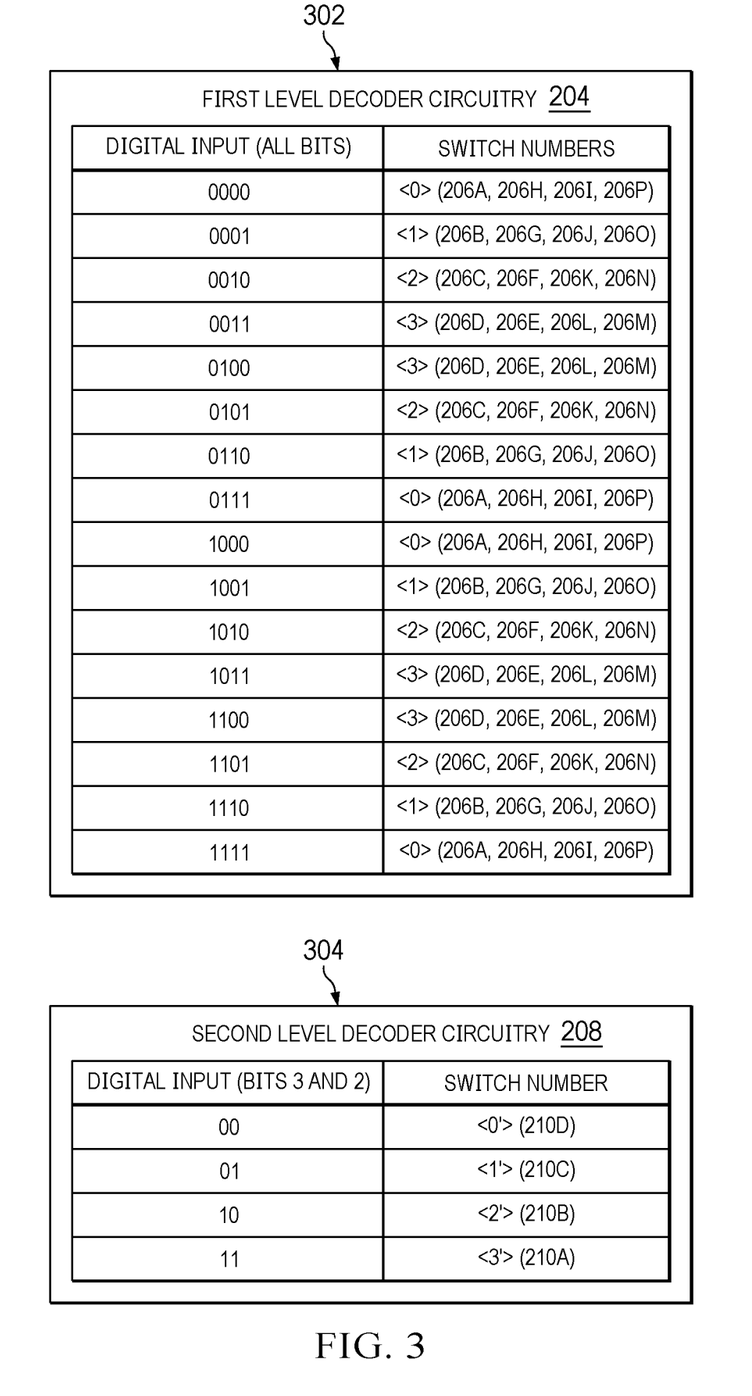
FIG. 3 includes a first table describing the inputs and outputs of the first level decoder circuitry of FIG. 2 and a second table describing the inputs and outputs of the second level decoder circuitry of FIG. 2.

FIG. 3 includes a first table describing the inputs and outputs of the first level decoder circuitry of FIG. 2 and a second table describing the inputs and outputs of the second level decoder circuitry of FIG. 2. Specifically, the example first level decoder circuitry 204 implements logic circuitry required to change switch states according to the first table 302 and the example second level decoder circuitry 208 implements logic circuitry required to change switch states according to the second table 304. The tables 302 and 304 may represent programmable tables stored in a memory of the respective decoder and/or may represent the functionality of hardwired circuitry of the respective decoder.

As described by the first table 302, each of the four bits from the example digital input bits 203 influence whether the example first level decoder circuitry 204 opens or closes a switch. For example, the bit values 0000, 0111, 1000, and 1111 would cause the example first level decoder circuitry 204 to close the <0> switches 206A, 206H, 206I, and 206P. The values 0000, 0111, 1000, and 1111 would also cause the example first level decoder circuitry 204 to open any of the <1>, <2>, or <3> first level switches that were previously closed. Similarly, bit values 0001, 0110, 1001, 1110 cause the example first level decoder circuitry 204 to close the <1> first level switches and open any previously closed <0>, <2>, <3> switches, etc. In some examples, numerically sequential input bit values (e.g., 0011 and 0100; 0111 and 1000; 1011 and 1100) are mapped to the same sets of first level switches such that the states of the first level switches do not change during a transition between the sequential input bit values. This may improve dynamic performance of the associated DAC circuitry.

As described by the second table 304, the example second level decoder circuitry 208 may only look at a subset of the most significant bits (e.g., the most significant two bits) to determine which of the second level switches 210A, 210B, 210C, 210D should change state. For example, the example second level decoder circuitry 208 may close switch 210D and open any previously closed second level switch whenever bits 3 and 2 are 00, regardless of whether bits 1 and 0 have values of 00, 01, 10, or 11. Similarly, the example second level decoder circuitry 208 closes switch 210C when bits 3 and 2 of the example digital input bits 203 are 01, etc.

One example of the example DAC circuitry 110, 120 minimizing the number of switch flips is a ramp function. A ramp function is an analog signal that is generated by sequential digital input values. For example, the ramp function produced by the example DAC circuitry 110, 120 may be 16 analog voltages where the first voltage corresponds to 0000, the second voltage corresponds to 0001, the third voltage corresponds to 0010, etc.

During the ramp function, the example DAC circuitry 110, 120 produces a fourth voltage corresponding to 0011 followed by a voltage corresponding to a fifth voltage corresponding to 0100. At the fourth voltage, the first table 302 and second table 304 show that switches 206D, 206E, 206L, 206M, 210D are closed and all other switches are open. At the fifth voltage, the first table 302 and second table 304 show that switches 206D, 206E, 206L, 206M, 210C are closed and all other switches are open. Therefore, the example DAC circuitry 110, 120 only requires two switch flips from the second level switches (i.e., open switch 210B and close switch 210C) when transitioning from the analog voltage corresponding to 0011 to the analog voltage corresponding to 0100.

Advantageously, the example first level decoder circuitry 204 keeps the first level switches 206A, 206B, . . . , 206P in a previous state determined by the input bits 0011 because switches 206D, 206E, 206L, 206M can remain closed during the transition between input bits 0011 and 0100. Similarly, the example DAC circuitry 110, 120 does not require any switch flips from the first level switches 206A, 206B, . . . , 206P when transitioning from digital input bits 0111 to 1000, and when transitioning from digital input bits 1011 to 1100. This contrasts with previous implementations of DAC circuitry, in which a 4-bit DAC requires first level switch flips at each voltage transition of a ramp function. In some examples, the example DAC circuitry 110, 120, may reduce switch flips when transitioning between different values of the digital input bits 203 other than those used to produce a ramp function. In examples of DAC circuitry 110, 120 that convert more than 4 digital bits to unique analog voltages, there may be additional voltage transitions during a ramp function that do not require switch flips from a level of switches.

By removing the need to change the state of certain switches during a ramp function, the example DAC circuitry 110, 120 decreases leakage current, reduces the magnitude of DNL, and is more accurate in comparison to previous implementations of DAC circuitry.

Figure 4:
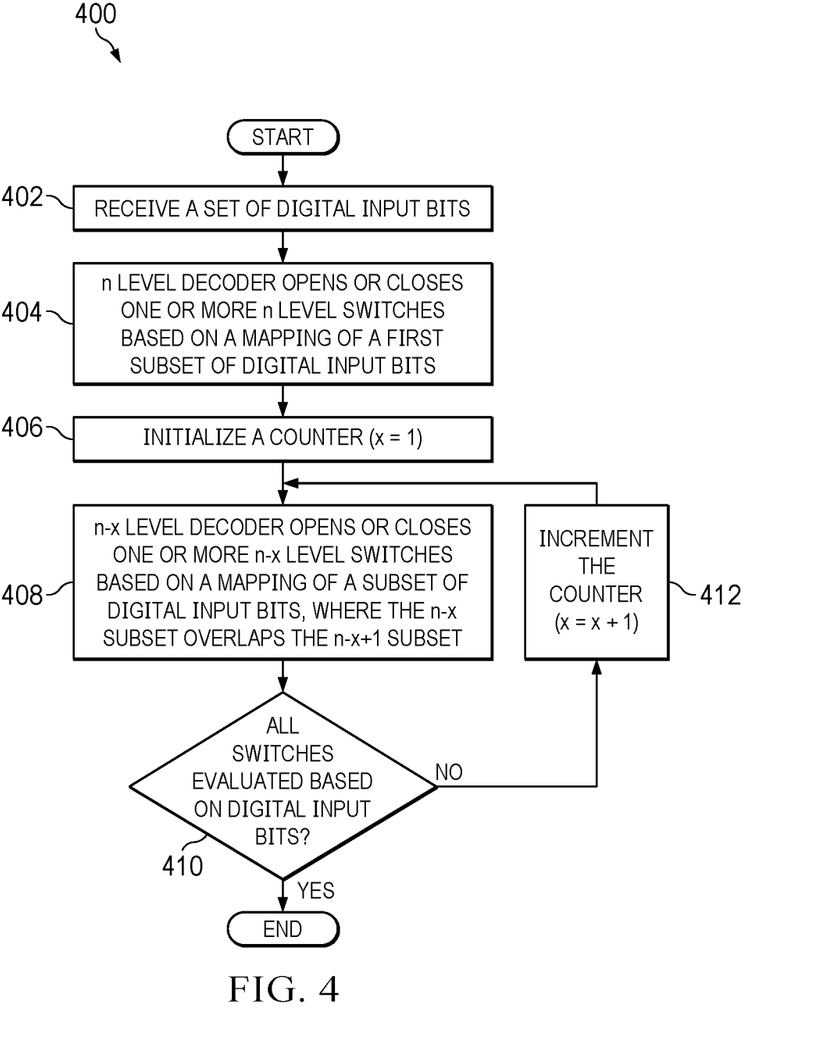
FIG. 4 is a flowchart representative of example operations that may be executed and/or instantiated by the DAC circuitry of FIG. 1 to produce an analog voltage.

FIG. 4 is a flowchart representative of example operations that may be executed and/or instantiated by the DAC circuitry of FIG. 1 to produce an analog voltage. The example operations 400 are generalized to any implementation of the DAC circuitry 110, 120. As such, the number of decoders in the example DAC circuitry 110, 120 may be referred to as a variable n. In the example block diagram of FIG. 2, n=2.

The example operations 400 begin when the DAC circuitry 110, 120 receives a set of digital input bits 203. (Block 402.) The digital input bits 203 may be of any format and any number.

The example n level decoder circuitry opens or closes one or more n level switches based on a mapping of a first subset of the digital input bits. (Block 404.) In the example block diagram of FIG. 2, block 404 is implemented when the second level decoder circuitry 208 opens or closes the second level switches 210A, 210B, 210C, 210D using bits 3 and 2 and according to the second table 304.

The example DAC circuitry 110, 120 initializes a counter. (Block 406.) In the example operations 400, the counter is initialized as x=1. In some examples, an example manufacturer may initialize the counter of block 406 when determining which bits the various decoders of the example DAC circuitry 110, 120 should use as inputs. In such examples, the example DAC circuitry 110, 120 may not initialize the counter of block 406 while in operation.

The example n−x level decoder circuitry opens or closes one or more switches based on a mapping of a subset of the digital input bits, where the n−x subset overlaps the n−x+1 subset. (Block 408.) In the example block diagram of FIG. 2, block 408 is implemented when the first level decoder circuitry 204 opens or closes the first level switches 206A, 206B, . . . , 206P using bits 3 through 0 and according to the first table 302. In the example block diagram, bits 3 and 2 overlap both the n−x+1 subset (i.e., the example second level decoder circuitry 208) and the n−x subset (i.e., the example first level decoder circuitry 204).

The example DAC circuitry 110, 120, determines whether all switches have been evaluated based on the digital input bits 203. (Block 410). In the example block diagram of FIG. 2, the example DAC circuitry 110, 120 determines all switches are evaluated after the first level decoder circuitry 204 and second level decoder circuitry 208 open and close the first level switches 206A, 206B, . . . , 206P and second level switches 210A, 210B, 210C, 210D.

If all switches have been evaluated based on the digital input bits 203, the example DAC circuitry 110, 120 is generating an analog voltage corresponding to the digital input bits 203 and the example operations 400 end. If all switches have not been evaluated based on the digital input bits 203, the example DAC circuitry 110, 120 increments the counter. (Block 412). After block 412, the example operations 400 return to block 408, where the next decoder (i.e., the n−x level decoder) opens or closes corresponding switches based on a subset of digital input bits that overlaps the digital input bits used by the previous decoder (i.e., the n−x+1 level decoder).

In the example operations 400, the counter is incremented as x=x+1. In some examples, an example manufacturer may increment the counter of block 412 when determining which bits the various decoders of the example DAC circuitry 110, 120 should use as inputs. In such examples, the example DAC circuitry 110, 120 may not increment the counter of block 412 while in operation.

Figure 5:
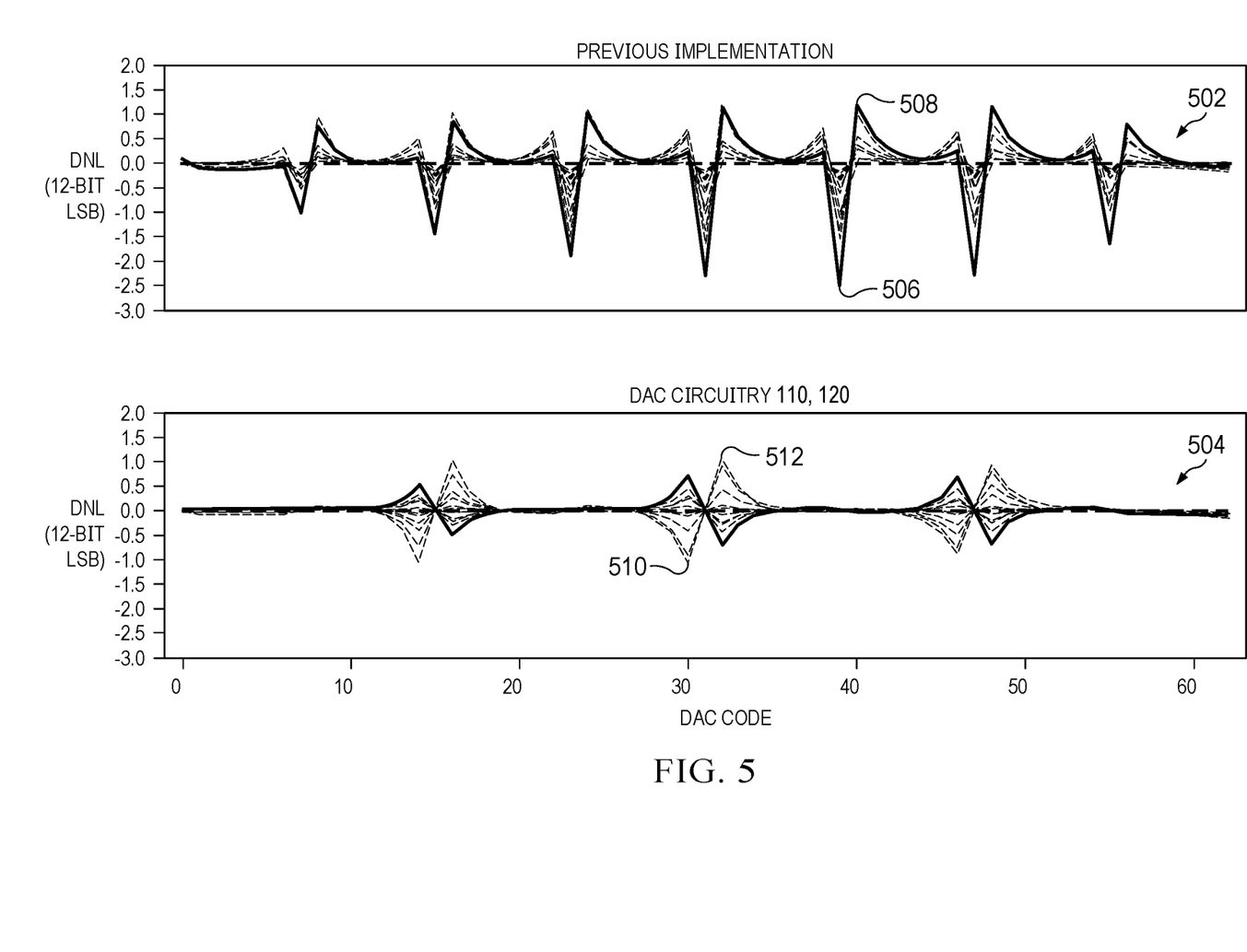
FIG. 5 shows two graphs that compares the performance of the DAC circuitry of FIG. 1 to the performance of previous DAC circuitry implementations.

FIG. 5 shows two graphs that illustrate the performance of the DAC circuitry of FIGS. 1, 5. FIG. 5 includes a first graph 502 and a second graph 504. The first graph includes a first minimum 506 and a first maximum 508. The second graph includes a second minimum 510 and a second maximum 512.

The first graph 502 shows the performance of a previous implementation of a 6-bit DAC circuit across multiple outputs of a ramp function. The x axis of the first graph 502 refers to the six bit digital values accepted by the previous DAC circuitry implementation. The x axis is listed in units of base 10, so 0 corresponds to bits 000000, 32 corresponds to bits 100000, etc. They axis of the first graph 502 refers to the DNL error experienced by the previous DAC circuitry implementation when producing an analog voltage that corresponds to the digital input value of the x axis. The y axis is listed in units of LSBs, which describes the difference between the input digital value and an output digital value, where the analog voltage produced by the DAC corresponds to the output digital value on a continuous spectrum.

Previous DAC circuitry implementations use a large amount of switch flips to produce analog voltages, which results in high leakage current and voltages that are misrepresentative of the input digital value. As a result, the previous DAC circuitry implementation of FIG. 5 exhibits a first minimum 506 with a DNL error of approximately −2.5 LSB, and a first maximum 508 with a DNL error of approximately +1.3 LSB. In addition to DNL error with large magnitudes, the previous DAC circuitry implementation also exhibits significant integral nonlinearity (INL) error. INL error refers to the sum of DNL over a given voltage transition. Like DNL, INL values at or near 0 indicate higher accuracy than INL values with greater magnitudes. However, the first graph 502 shows that the sum of the first minimum 506 and first maximum 508 result in an INL error of approximately −1.2 LSB.

The second graph 504 shows the performance of the example DAC circuitry 110, 120 when implemented as a 6-bit DAC circuit. The second graph 504 shows the example DAC circuitry 110, 120, output across multiple instances generating the same ramp function as the first graph 502. The example DAC circuitry 110, 120 uses less switch flips to produce analog voltages than the previous DAC circuitry implementation, which results in less leakage current and voltages that are more representative of the input digital value. As a result, the example DAC circuitry 110, 120 exhibits a second minimum 510 with a DNL error of approximately −1.1 LSB and a second maximum 512 with a DNL error of approximately +1.1 LSB. As a result, the INL error for the example DAC circuitry 110, 120 is approximately 0 LSB.

FIG. 5 illustrates that the example DAC circuitry 110, 120 exhibits smaller magnitudes of DNL and INL error than the previous DAC circuitry 500. As such, examples disclosed herein improve the accuracy of DAC circuitry without incurring additional power usage.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the accuracy of DAC circuitry without incurring additional power usage. Example DAC circuitry 110, 120 implements decoder circuitry that overlaps digital input bits across levels of switches, which reduces the total number of switch flips, DNL, and INL error when compares to previous implementations.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A device, comprising:
   resistor ladder circuitry including a plurality of resistors coupled in series and having a plurality of intermediate voltage nodes therebetween;
   a first plurality of switches having inputs coupled to the plurality of intermediate voltage nodes and having outputs;
   first level decoder circuitry configured to:
      receive a first set of bit values; and
      based on the first set of bit values, close a first subset of switches of the first plurality of switches;
   a second plurality of switches having inputs coupled to the outputs of the first plurality of switches and having outputs coupled to a common node; and
   second level decoder circuitry configured to:
      receive the first set of bit values; and
      based on the first set of bit values, close a first switch of the second plurality of switches.

2. The device of claim 1, wherein
   the first level decoder circuitry is further configured to:
      receive a second set of bit values that is different from the first set of bit values; and
      based on the second set of bit values, keep the first subset of switches of the first plurality of switches closed.

3. The device of claim 2, wherein the second level decoder circuitry is further configured to:
   receive the second set of bit values; and
   based on the second set of bit values, close a second switch of the second plurality of switches, wherein the second switch of the second plurality of switches is different from the first switch of the second plurality of switches.

4. The device of claim 1, wherein the input of the first switch of the second plurality of switches is coupled to the outputs of the first subset of switches of the first plurality of switches.

5. The device of claim 1, wherein:
   the first level decoder circuitry is configured to close the first subset of switches based on an entirety of the first set of bit values; and
   the second level decoder circuitry is configured to close the first switch based on a partial portion of the first set of bit values.

6. The device of claim 1, wherein the plurality of resistors has one same resistance value.

7. The device of claim 1, wherein the first level decoder circuitry is configured to close or open the first subset of switches of the first plurality of switches as a group such that the first subset of switches is closed or opened altogether.

8. A method, including:
   receiving, at a digital to analog converter (DAC), a first set of bit values, wherein the DAC comprises a plurality of resistors coupled in series and having a plurality of intermediate voltage nodes therebetween, a first plurality of switches having inputs coupled to the plurality of intermediate voltage nodes and having outputs, and a second plurality of switches having inputs coupled to the outputs of the first plurality of switches and having outputs coupled to a common node;
   closing, by first level decoder circuitry of the DAC based on the first set of bit values, a first subset of switches of the first plurality of switches; and
   closing, by second level decoder circuitry of the DAC based on the first set of bit values, a first switch of the second plurality of switches.

9. The method of claim 8, comprising:
   receiving, at the DAC, a second set of bit values that is different from the first set of bit values; and
   keeping, by the first level decoder circuitry based on the second set of bit values, the first subset of switches of the first plurality of switches closed.

10. The method of claim 9, comprising:
    closing, by the second level decoder circuitry based on the second set of bit values, a second switch of the second plurality of switches, wherein the second switch of the second plurality of switches is different from the first switch of the second plurality of switches.

11. The method of claim 10, wherein the first set of bit values is numerically sequential with the second set of bit values.

12. The method of claim 8, wherein:
    closing, by the first level decoder circuitry of the DAC, the first subset of switches of the first plurality of switches comprises closing the first subset of switches based on at least in part one or more least significant bit values of the first set of bit values; and
    closing, by the second level decoder circuitry of the DAC, the first switch of the second plurality of switches comprises closing the first switch based on only one or more most significant bit values of the first set of bit values.

13. The method of claim 8, comprising:
    providing an input voltage to the plurality of resistors; and
    generating an output voltage at the common node.

14. The method of claim 8, wherein:
    the first subset of switches of the first plurality of switches is closed or opened as a group altogether;
    the first plurality of switches further includes a second subset of switches that is closed or opened as a group altogether;
    the first subset of switches of the first plurality of switches includes a third switch and a fourth switch;
    the second subset of switches of the first plurality of switches includes a fifth switch and a sixth switch;
    the inputs of the third, fourth, fifth, and sixth switches are coupled to different intermediate voltage nodes of the plurality of intermediate voltage nodes;
    the output of the third switch is coupled to the output of the fifth switch; and
    the output of the fourth switch is coupled to the output of the sixth switch.

15. A device, comprising:
    a plurality of resistors coupled in series and having a plurality of intermediate voltage nodes therebetween;
    a first plurality of switches including a first switch and a second switch each having an input and an output, the input of the first switch coupled to a first intermediate voltage node of the plurality of intermediate voltage nodes, and the input of the second switch coupled to a second intermediate voltage node of the plurality of intermediate voltage nodes;

first level decoder circuitry configured to:
   receive a first set of bit values; and
   based on the first set of bit values, close the first switch and second switch;
a second plurality of switches including a third switch and a fourth switch each having an input and an output, the input of the third switch coupled to the output of the first switch, the input of the fourth switch coupled to the output of the second switch, and the output of the third switch coupled to the output of the fourth switch; and
second level decoder circuitry configured to:
   receive the first set of bit values; and
   based on the first set of bit values, close the third switch and open the fourth switch.

16. The device of claim 15, wherein
the first level decoder circuitry is further configured to:
   receive a second set of bit values that is different from the first set of bit values; and
   based on the second set of bit values, keep the first switch and second switch closed.

17. The device of claim 16, wherein the second level decoder circuitry is further configured to:
   receive the second set of bit values; and
   based on the second set of bit values, open the third switch and close the fourth switch.

18. The device of claim 15, wherein the first set of bit values is numerically sequential with the second set of bit values.

19. The device of claim 15, wherein:
the first level decoder circuitry is configured to close the first switch and second switch based at least in part on one or more least significant bit values of the first set of bit values; and
the second level decoder circuitry is configured to close the third switch and open the fourth switch based on only one or more most significant bit values of the first set of bit values.

20. The device of claim 15, wherein the second plurality of switches is configured to:
provide a first voltage representing an analog value of the first set of bit values at the outputs of the third switch and fourth switch when the third switch is closed and the fourth switch is open; and
provide a second voltage representing an analog value of the second set of bit values at the outputs of the third switch and fourth switch when the third switch is open and the fourth switch is closed.

\* \* \* \* \*